(12) United States Patent
Poli et al.

(10) Patent No.: US 7,494,834 B2
(45) Date of Patent: Feb. 24, 2009

(54) METHOD OF MANUFACTURING A TRANSPARENT ELEMENT INCLUDING TRANSPARENT ELECTRODES

(75) Inventors: Gian Carlo Poli, Les Geneveys-sur-Coffrane (CH); Joachim Grupp, Enges (CH)

(73) Assignee: Asulab S.A., Marin (CH)

( * ) Notice: Subject to any disclaimer, the term of this patent is extended or adjusted under 35 U.S.C. 154(b) by 302 days.

(21) Appl. No.: 11/424,700

(22) Filed: Jun. 16, 2006

(65) Prior Publication Data

US 2006/0286702 A1 Dec. 21, 2006

(30) Foreign Application Priority Data

Jun. 16, 2005 (EP) .................................. 05012998

(51) Int. Cl.
*H01L 21/00* (2006.01)
*H01L 27/15* (2006.01)
*H01L 29/26* (2006.01)
*H01L 31/12* (2006.01)
*H01L 33/00* (2006.01)
*G02F 1/1335* (2006.01)

(52) U.S. Cl. .......................... 438/30; 438/597; 257/79; 257/E31.126; 349/96

(58) Field of Classification Search ....................... None
See application file for complete search history.

(56) References Cited

U.S. PATENT DOCUMENTS

| 6,034,813 | A | * | 3/2000 | Woodard et al. | ............ 359/360 |
| 6,858,352 | B1 | | 2/2005 | Band | |
| 7,247,568 | B2 | * | 7/2007 | Grupp et al. | ................. 438/694 |
| 2005/0130400 | A1 | * | 6/2005 | Grupp et al. | ................. 438/609 |
| 2005/0140278 | A1 | * | 6/2005 | Kato | ........................... 313/504 |
| 2006/0283498 | A1 | * | 12/2006 | Gronet | ........................ 136/256 |
| 2006/0286702 | A1 | * | 12/2006 | Poli et al. | ..................... 438/30 |

(Continued)

FOREIGN PATENT DOCUMENTS

DE 201 22 323 U1 5/2005

(Continued)

OTHER PUBLICATIONS

Austrian Search Report in corresponding Singapore application No. 200603964-8, completed Dec. 27, 2006.

(Continued)

*Primary Examiner*—Walter L Lindsay, Jr.
(74) *Attorney, Agent, or Firm*—Griffin & Szipl, P.C.

(57) ABSTRACT

Method of manufacturing a transparent element including transparent electrodes, said method including the steps of:
depositing over at least one part of the surface of a transparent substrate (1) a layer (2) of a conductive oxide that is also transparent, and
structuring in said conductive oxide layer (2) at least one electrode (4) connected to a contact pad (8) by a conductive path (6) by removing said oxide along the contour of the desired electrode (4, 6, 8) so as to create a trimming line (10) which will insulate the part (12) of the conductive oxide layer (2), which forms the electrode (4, 6, 8) and which is to be brought to an electric potential, from the rest (14) of the conductive oxide layer (2) which will be floating,
this method being wherein at least a second trimming line (10') is made around the first (10).

24 Claims, 3 Drawing Sheets

U.S. PATENT DOCUMENTS

| | | | |
|---|---|---|---|
| 2007/0046183 A1* | 3/2007 | Kwok et al. | 313/504 |
| 2007/0103066 A1* | 5/2007 | D'Andrade et al. | 313/506 |
| 2007/0159574 A1* | 7/2007 | Burberry et al. | 349/74 |
| 2007/0178619 A1* | 8/2007 | Forrest et al. | 438/57 |
| 2007/0210700 A1* | 9/2007 | Kato et al. | 313/504 |
| 2007/0241668 A1* | 10/2007 | Otterman et al. | 313/504 |
| 2007/0268580 A1* | 11/2007 | Biebel et al. | 359/479 |
| 2008/0053518 A1* | 3/2008 | Chang et al. | 136/252 |
| 2008/0060698 A1* | 3/2008 | Watanabe et al. | 136/265 |
| 2008/0185036 A1* | 8/2008 | Sasaki et al. | 136/252 |
| 2008/0204635 A1* | 8/2008 | Van Popta et al. | 349/96 |

FOREIGN PATENT DOCUMENTS

| | | |
|---|---|---|
| EP | 09 38 135 A2 | 8/1999 |
| EP | 0 969 517 A1 | 1/2000 |
| EP | 1 394 640 A1 | 3/2004 |
| EP | 1 450 416 A1 | 8/2004 |
| EP | 1 457 865 A1 | 9/2004 |
| EP | 1 544 178 | 6/2005 |
| GB | 784673 | 10/1967 |
| JP | 60-260392 | 12/1985 |
| WO | 92/13328 | 8/1992 |

OTHER PUBLICATIONS

European Search Report issued in corresponding application No. EP 05 01 2998 completed Apr. 18, 2006.

* cited by examiner

METHOD OF MANUFACTURING A TRANSPARENT ELEMENT INCLUDING TRANSPARENT ELECTRODES

This application claims priority from European Patent Application No. 05012998.0 filed Jun. 16, 2005, the entire disclosure of which is incorporated herein by reference.

FIELD OF THE INVENTION

The present invention concerns a method of manufacturing a transparent element including electrodes that are also transparent and whose contours must not be visible to the naked eye.

"Transparent element" means, in non-limiting manner, spectacle lenses, watch crystals, capacitive touch screens for example structured on watch crystals, or even the transparent substrates of a liquid crystal display cell or a photovoltaic cell.

BACKGROUND OF THE INVENTION

Currently, the method of structuring the electrodes of a capacitive touch screen consists in depositing on a transparent substrate, for example made of glass, a layer of transparent conductive oxide such as indium-tin-oxide or ITO. After deposition, the ITO layer is removed from the entire surface of the subjacent substrate except at the places where electrodes have to remain. The substrate thus has large surfaces free of ITO, which must be compensated for optically since the refractive indices of the substrate and ITO are not identical. This optical compensation is performed by the deposition of thin non-conductive layers whose refractive indices are adapted to those of the substrate and ITO. Despite all the precautions taken, these optically compensated zones remain visible from certain angles of sight or in certain lighting conditions.

In order to overcome this problem, it has been proposed to remove the ITO only from along the contour of the electrodes. This solution is known, for example, from JP 60-260392 and WO 92/13328. The electrodes can be trimmed by photolithography or by laser ablation. The width of the trimming line can be made sufficiently thin (around 20 µm) that optical compensation for said line via depositions of dielectric layers with suitable optical indices does not raise any particular problem. One could even envisage making the trimming line so thin (width of the order of 5 µm) that the latter is invisible to the naked eye, without the necessity of providing additional optical compensation layers.

However, the thinner the trimming line, the greater the risk that small fragments of conductive material, capable of causing short-circuits, will remain. In order to overcome this problem, JP 60-260392 proposes cleaning the substrate, after laser ablation, by means of ultrasounds in a bath of cleaning fluid, such as alcohol. However, wet phase treatments are usually avoided since they slow down the rate of output and thus increase production costs.

Another drawback of the aforementioned method lies in the fact that stray capacitive couplings can occur between the electrodes which are brought to a fixed potential and the rest of the ITO surface, which is floating. Such stray capacitive couplings are capable of disturbing the proper operation of the capacitive touch screen, especially when the signal addressing frequency of the electrodes is high.

In order to overcome the aforementioned drawbacks, in addition to others, the present invention proposes a manufacturing method that enables the wet phase cleaning to be omitted.

SUMMARY OF THE INVENTION

The present invention therefore concerns a method of manufacturing a transparent element including transparent electrodes, this method including the steps of:
depositing over at least one part of the surface of a transparent substrate a layer of a conductive oxide that is also transparent, and
structuring at least one electrode in the conductive oxide layer by removing said oxide along the contour of the desired electrode so as to create a trimming line which will insulate the part of the conductive oxide layer that forms the electrode and which is to be brought to an electric potential from the rest of the conductive oxide layer which will be floating,
this method being characterized in that at least a second trimming line is made around the first trimming line.

Owing to these features, the present invention provides a method of manufacturing a transparent element including electrodes that are also transparent, which enables the electrodes to be trimmed along a very thin line while considerably reducing the risk of short-circuits that can result from such trimming. In fact, the probabilities of conductive particles that could cause short circuits remaining when the conductive oxide is removed a first, and then a second time along the contour of the electrodes are not added together but multiplied, such that the resulting probability is substantially smaller than the probabilities of which it is the product. The width of the trimming lines can thus be reduced to values comprised between 1 µm and 10 µm and preferably equal to 5 µm, such that the trimming lines are invisible to the naked eye and do not imperatively require optical compensation via additional depositions of non-conductive optical compensation layers whose refractive indices are adapted to those of the substrate and the conductive oxide layer. Moreover, this method reduces the risk of stray capacitive couplings between the active and floating zones of the conductive oxide layer.

As a first approach, one can simply remove the oxide along the contour of the electrodes along a single trimming line, but measures must nonetheless be taken to limit stray capacitive couplings as far as possible.

This is why, according to a second aspect, the present invention concerns a method of manufacturing a transparent element including transparent electrodes, said method including the steps of:
depositing over at least one part of the surface of a transparent substrate a layer of a transparent conductive oxide, and
structuring in the conductive oxide layer at least one electrode by removing said oxide along the contour of the desired electrode so as to create a trimming line which will insulate the active part of the conductive oxide layer, which forms the electrode and which will be brought to an electric potential from the rest of the conductive oxide layer which will be floating,
said method being characterized in that the floating conductive oxide layer is segmented into at least two distinct parts that are not electrically connected to each other, by removing said oxide along a line of separation.

Owing to these features, the present invention provides a method of manufacturing a transparent element including transparent electrodes that substantially reduces the risk of stray capacitive couplings between the active zones of the oxide layer which form the electrodes and which will be brought to an electric potential and the zones of the oxide layer which are floating, i.e. which are not connected to any potential. Thus, is less likelihood of stray couplings disturbing the proper operation of the electrodes, in particular when the addressing signal frequency of said electrodes is high.

The present invention also concerns a device including a transparent substrate covered with a transparent conductive oxide layer in which at least one electrode is structured, a trimming line separating the active part of the conductive oxide layer, which forms the electrode and which is brought to an electric potential from the rest of the conductive oxide layer which is floating, characterized in that it includes means for preventing any stray capacitive coupling between the active part and the floating part of said conductive oxide layer.

According to a first embodiment of the invention, the means for preventing capacitive coupling include a second trimming line formed around the first.

According to a second embodiment of the invention, the means for preventing capacitive coupling include one line which segments the floating part of the conductive oxide layer into at least two distinct zones that are not electrically connected.

BRIEF DESCRIPTION OF THE DRAWINGS

Other features and advantages of the present invention will appear more clearly from the following detailed description of one implementation of the method of the invention, this example being given purely by way of non-limiting illustration with reference to the annexed drawing, in which.

DETAILED DESCRIPTION OF THE ILLUSTRATIVE EMBODIMENTS

The present invention proceeds from the general inventive idea which consists in structuring a transparent conductive oxide layer deposited on a substrate that is also transparent by removing the thin lines of material, for example by laser ablation or by photolithographic etching. This structuring can cover two distinct, but nonetheless complementary, aspects: forming a second electrode trimming line around a first, or dividing the floating part of the conductive oxide layer into areas that are electrically insulated from each other. It is an object of the invention to reduce the stray capacitive coupling between the active zones, i.e. those brought to an electric potential and the floating zones, i.e. those that are not connected to any potential, of the conductive oxide layer in order to ensure that the electrodes work properly even with high frequency electrode addressing voltages. It is an additional object to ensure that the electrodes are invisible to the naked eye without the necessity of depositing additional optical compensation layers.

Figure 1:
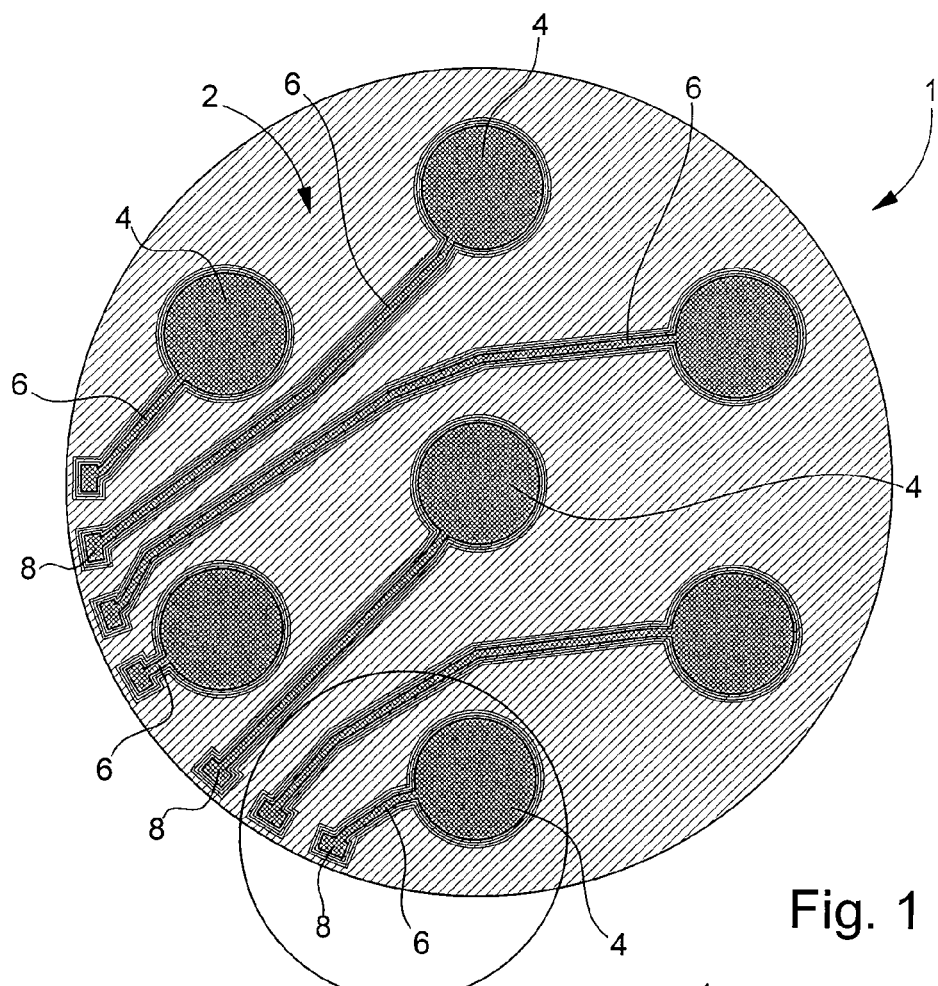
FIG. 1 is a bottom view of a transparent substrate covered with a transparent conductive oxide layer in which electrodes have been structured, said electrodes being separated from the rest of the conductive oxide layer by two concentric trimming lines.
Figure 2:
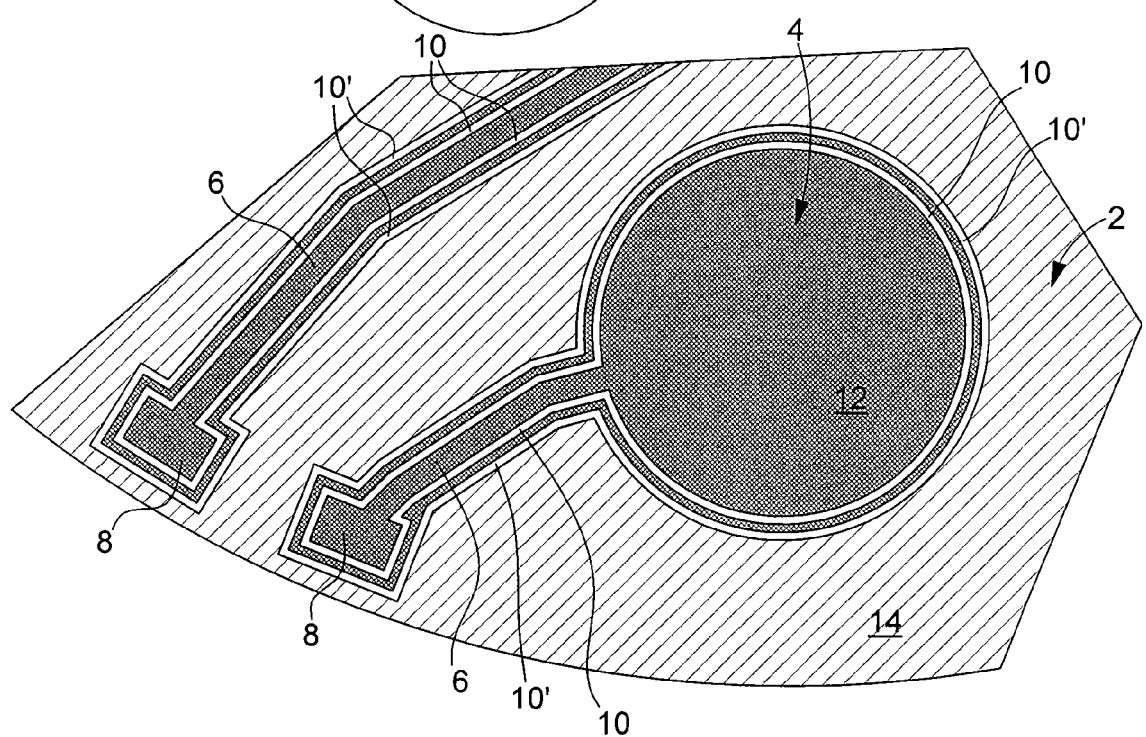
FIG. 2 is a detailed larger scale view of the zone surrounded by a circle in FIG. 1.
Figure 3:
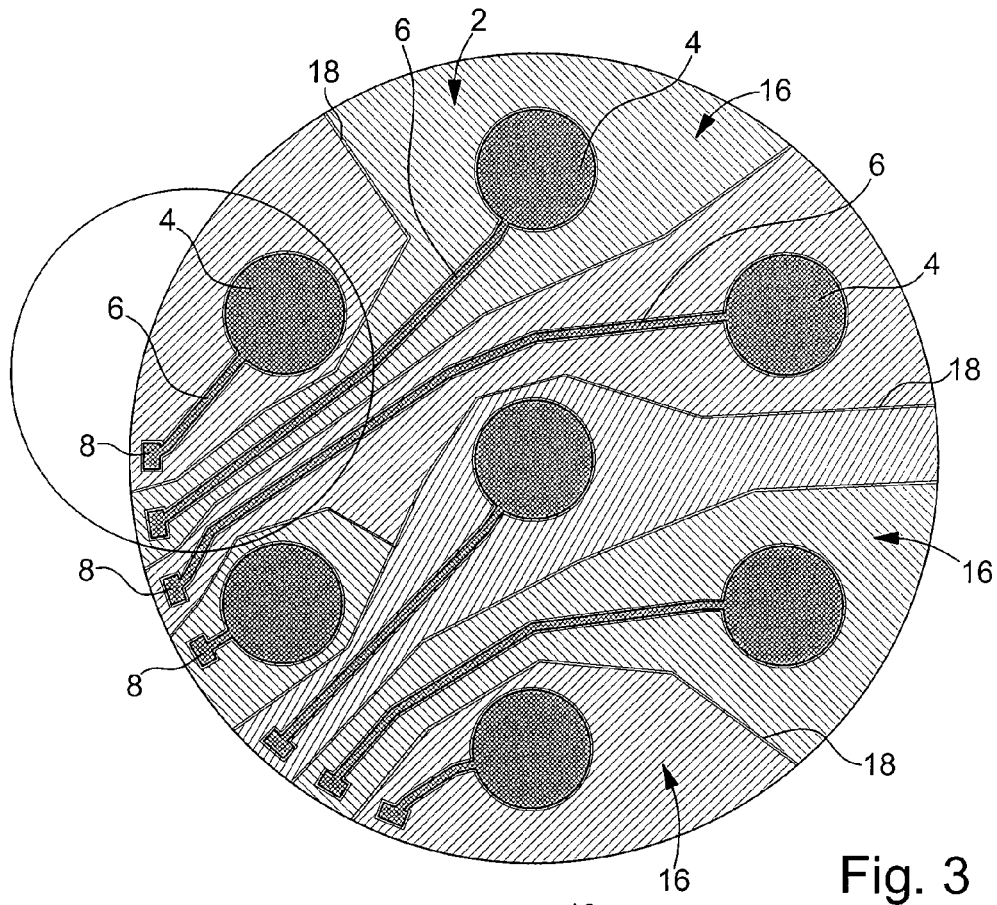
FIG. 3 is a similar view to that of FIG. 1, the floating part of the oxide layer being segmented into a plurality of areas that are electrically insulated from each other.
Figure 4:
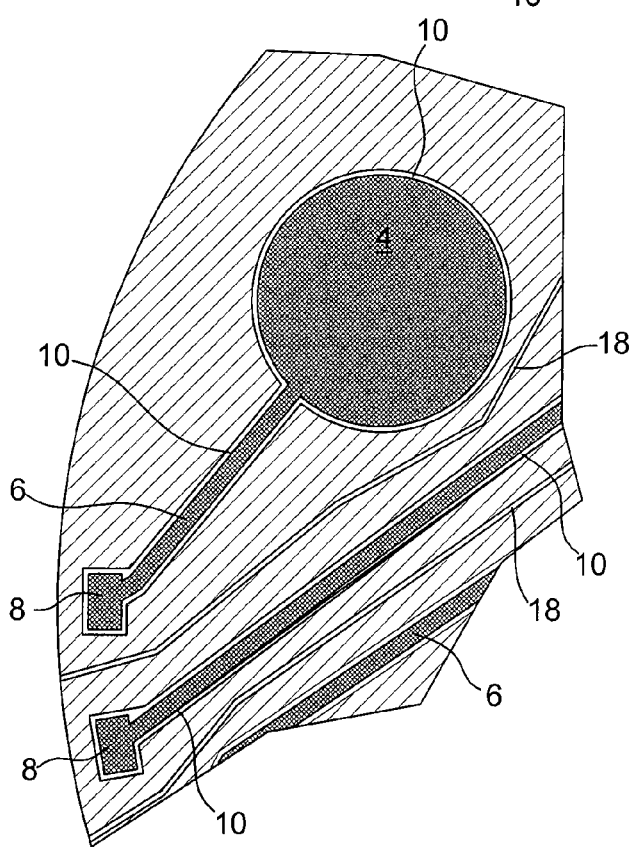
FIG. 4 is a detailed larger scale view of the zone surrounded by a circle in FIG. 3.

FIG. 1 is a bottom view of a transparent crystal 1, for example made of sapphire or tempered glass, to be mounted in a wristwatch (not shown). On the bottom face of crystal 1 a transparent conductive oxide layer 2 is deposited, in which electrodes 4 are structured, connected by conductive paths 6 to peripheral contact pads 8. These contact pads 8 will be connected to the electronic movement of the wristwatch or to a microprocessor for controlling the electronic time or other functions of the watch. In fact, electrodes 4 form capacitive touch sensors which can be activated by placing a finger on the external surface of crystal 2.

In a first step of the method according to the invention a layer of transparent conductive oxide such as indium-tin oxide is deposited over the entire surface of crystal 2, for example by evaporation. The thickness of the layer is typically comprised between 25 nm and 75 nm and preferably between 45 nm and 55 nm. It goes without saying that this example is only given by way of illustration and that the transparent conductive oxide could also be chosen among antimony doped $In_2O_3$ and $SnO_2$.

In a second step of the method according to the invention, the ITO is removed along the contour of electrodes 4, conductive paths 6 and contact pads 8. In the following description, reference will be made only to electrodes 4, for the sake of simplicity, given that the steps of the method that will be described in relation to said electrodes 4 also apply to conductive paths 6 and to contact pads 8.

Thus, the ITO is removed along the contour of electrodes 4 following a trimming line 10 whose width is comprised between 1 μm and 10 μm and preferably equal to 5 μm so that it cannot be detected by the naked eye. The removal of the ITO along the contour of electrodes 4 can be achieved, for example, by laser ablation, or by photolithography. Trimming electrodes 4 in this way electrically insulates the active part 12 of the ITO layer, which forms electrode 4 and which will be brought to an electric potential, from the rest 14 of the ITO layer which will be floating, i.e. it will not be connected to a potential. However, given the width of the trimming line for electrodes 4, there is a non-negligible risk of small ITO fragments remaining, capable of creating short-circuits. This is why, in accordance with a first aspect of the method according to the invention, the ITO is removed along the contour of electrodes 4 along a second trimming line 10' surrounding the first 10, thereby considerably reducing the likelihood of a short-circuit. In fact, the probabilities of conductive particles remaining, able to cause short-circuits when the conductive oxide is removed along the contour of the electrodes, along two concentric trimming lines are not added together but multiplied, such that the resulting probability is substantially lower than the probabilities of which it is a product. Likewise, the likelihood of stray capacitive coupling between the active zones of the ITO layer, which form the electrodes and which will be brought to an electric potential and the floating zones of said layer, which are not connected to any potential, are substantially reduced.

In fact, the stray capacitive coupling $\underline{C}$ which is set up between two electrodes of width $\underline{w}$ and at a distance $\underline{d}$ from each other, is given by the relation: $C = \epsilon_0 * \epsilon_r * w/d$ where $\epsilon_o$ is the dielectric constant of the vacuum and $\epsilon_r$ is the relative dielectric constant of the substrate on which the electrodes are structured. Thus, with width $\underline{w}$ constant, when the electrodes are moved closer to each other, the resulting stray capacitance $\underline{C}$ increases. However, trimming the electrodes several times is equivalent to connecting several capacitors in series between them. In the knowledge that the capacitance equivalent to n series mounted capacitors of capacitance C is equal to C/n where n is a natural integer number, the larger the number of series mounted capacitors, in other words the higher the number of trimming lines around the electrodes, the lower the resulting stray capacitance will be.

According to a simplified variant implementation of the method according to the invention, the oxide can simply be removed along the contour of the electrodes along a single trimming line, while safety measures are taken to overcome any problem of residual capacitive coupling.

Thus, according to a second aspect of the invention, the floating part 14 of the ITO layer is segmented into areas 16 that are electrically insulated from each other by removing the ITO along separation lines 18. In doing so, one avoids the risk of stray capacitive coupling between the electrodes and the floating zones of the ITO layer via the finger.

Figure 5:
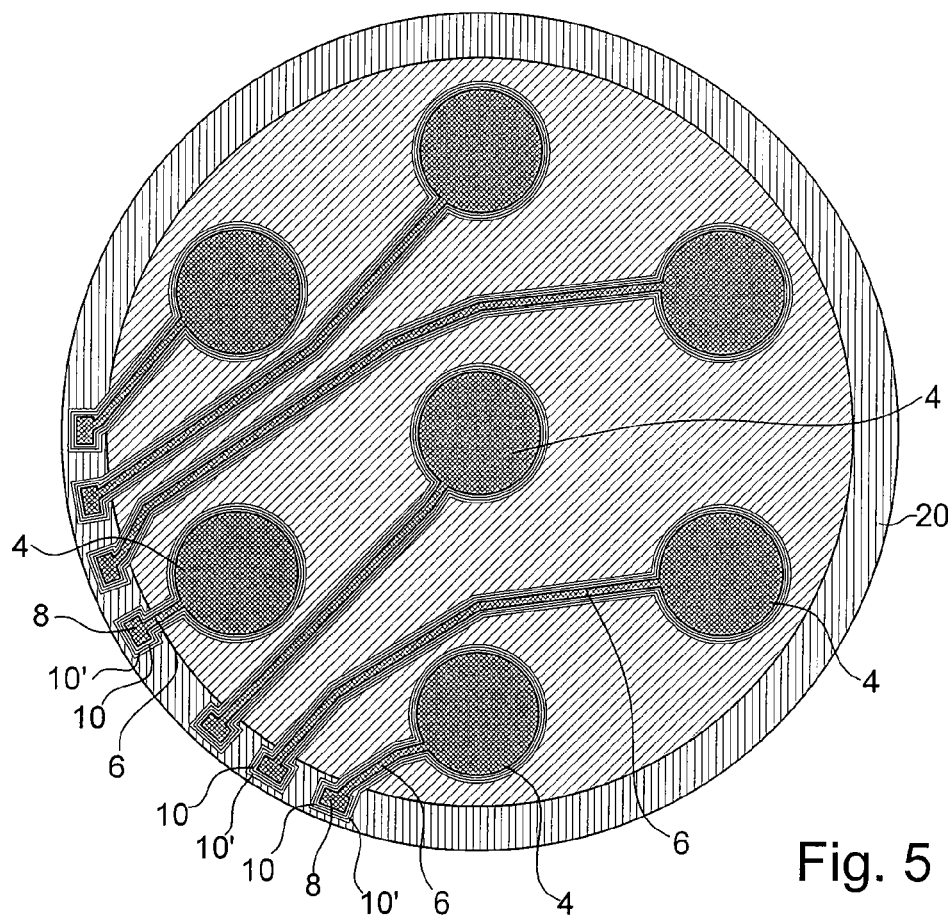
FIG. 5 is a bottom view of a watch crystal whose periphery is metallized.
Figure 6A:
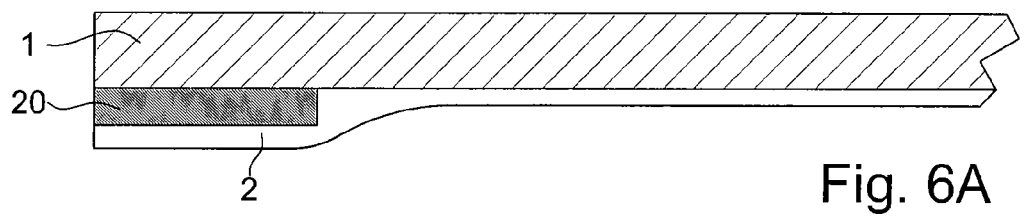
FIGS. 6A and 6B are cross-sections of the watch crystal shown in FIG. 5, which illustrate two embodiments of the metallization and the transparent conductive oxide layer.
Figure 6B:
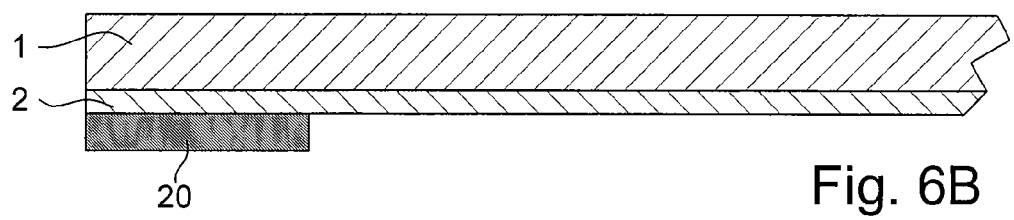

It goes without saying that the present invention is not limited to the embodiments that have just been described and that various simple modifications and variants can be envisaged by those skilled in the art without departing from the scope of the invention as defined by the annexed claims. In particular, despite the small width of the trimming lines, one could envisage optically compensating for the latter by successive depositions of a first layer of a transparent dielectric having a low refractive index and a second layer of another dielectric having a higher refractive index relative to that of the first layer as taught by European Patent Application No. 03028874.0 in the name of the same Applicant. In the case of a watch crystal, one could also envisage applying the method according to the invention to a metallization layer 20 deposited along the periphery of said crystal 1 as illustrated in FIG. 5. According to a first variant, an ITO layer is deposited over the entire surface of the crystal then the metallization layer is deposited on top of said ITO layer (see FIG. 5A). According to a second variant illustrated in FIG. 5B, the metallization layer is first of all deposited on the periphery of the crystal, then the ITO layer is deposited such that the latter at least partially covers said metallization layer. After this, electrodes 4, conductive paths 6 and contact pads 8 are trimmed along two concentric trimming lines 10 and 10' so as to remove both the ITO and the metallization layer at contact pads 8. Finally, it goes without saying that double trimming of the electrodes can be combined with segmenting the floating part of the oxide layer.

What is claimed is:

1. A method of manufacturing a transparent element including transparent electrodes, said method including the steps of:
   depositing over at least one part of the surface of a transparent substrate a layer of a conductive oxide that is also transparent, and
   structuring in said conductive oxide layer at least one electrode connected to a contact pad by a conductive path by removing said oxide along the contour of the desired electrode so as to create a trimming line which will insulate the part of the conductive oxide layer, which forms the electrode and which is to be brought to an electric potential, from the rest of the conductive oxide layer which will be floating,
   wherein this method further includes the step of making at least a second trimming line around the first trimming line.

2. A method of manufacturing a transparent element including transparent electrodes, said method including the steps of:
   depositing over at least one part of the surface of a transparent substrate a layer of a transparent conductive oxide, and
   structuring in the conductive oxide layer at least one electrode connected to a contact pad by a conductive path by removing said oxide along the contour of the desired electrode so as to create a trimming line which will insulate the active part of the conductive oxide layer, which forms the electrode and which will be brought to an electric potential, from the rest of the conductive oxide layer which will be floating,
   wherein said method further includes the step of segmenting the floating conductive oxide layer into at least two distinct parts that are not electrically connected to each other, by removing said oxide along a line of separation.

3. A method of manufacturing a transparent element including transparent electrodes, this method including the steps of:
   depositing over at least one part of the surface of a transparent substrate a layer of a conductive oxide that is also transparent, and
   structuring in said conductive oxide layer at least one electrode connected to a contact pad by a conductive path by removing said oxide along the contour of the desired electrode so as to create a trimming line which will insulate the part of the conductive oxide layer, which forms the electrode and which is to be brought to an electric potential, from the rest of the conductive oxide layer which will be floating,
   wherein this method further includes the step of making at least a second trimming line around the first trimming line and wherein the floating conductive oxide layer is segmented into at least two distinct parts that are not electrically connected to each other, by removing said oxide along a line of separation.

4. The method according to claim 1, wherein, after the transparent conductive oxide layer has been deposited, a metallization layer is deposited on the periphery of the substrate above said conductive oxide layer, then the electrodes, the conductive paths and the contact pads are trimmed along the trimming lines so as to remove both the conductive oxide and the metallization layer on the contact pads.

5. The method according to claim 3, wherein, after the transparent conductive oxide layer has been deposited, a metallization layer is deposited on the periphery of the substrate above said conductive oxide layer, then the electrodes, the conductive paths and the contact pads are trimmed along the trimming lines so as to remove both the conductive oxide and the metallization layer on the contact pads.

6. The method according to claim 1, wherein a metallization layer is first deposited on the periphery of the substrate, then the transparent oxide layer is deposited such that said oxide layer at least partially covers said metallization layer, then the electrodes, the conductive paths and the contact pads are trimmed along the trimming lines so as to remove both the conductive oxide and the metallization layer on the contact pads.

7. The method according to claim 3, wherein a metallization layer is first deposited on the periphery of the substrate, then the transparent oxide layer is deposited such that said oxide layer at least partially covers said metallization layer, then the electrodes, the conductive paths and the contact pads are trimmed along the trimming lines so as to remove both the conductive oxide and the metallization layer on the contact pads.

8. The method according to claim 1, wherein the trimming lines and the separation lines are optically compensated for by depositing at least one optical compensation layer.

9. The method according to claim 2, wherein the trimming lines and the separation lines are optically compensated for by depositing at least one optical compensation layer.

10. The method according to claim 3, wherein the trimming lines and the separation lines are optically compensated for by depositing at least one optical compensation layer.

11. The method according to claim 4, wherein the trimming lines and the separation lines are optically compensated for by depositing at least one optical compensation layer.

12. The method according to claim 5, wherein the trimming lines and the separation lines are optically compensated for by depositing at least one optical compensation layer.

13. The method according to claim 8, wherein a first layer of a transparent dielectric material having a low refractive index and a second layer of another transparent dielectric material having a high refraction index in relation to that of the first layer are deposited in succession.

14. The method according to claim 9, wherein a first layer of a transparent dielectric material having a low refractive index and a second layer of another transparent dielectric material having a high refraction index in relation to that of the first layer are deposited in succession.

15. The method according to claim 10, wherein a first layer of a transparent dielectric material having a low refractive index and a second layer of another transparent dielectric material having a high refraction index in relation to that of the first layer are deposited in succession.

16. The method according to claim 11, wherein a first layer of a transparent dielectric material having a low refractive index and a second layer of another transparent dielectric material having a high refraction index in relation to that of the first layer are deposited in succession.

17. The method according to claim 12, wherein a first layer of a transparent dielectric material having a low refractive index and a second layer of another transparent dielectric material having a high refraction index in relation to that of the first layer are deposited in succession.

18. The method according to claim 1, wherein the width of the trimming and separation lines is between 1 µm and 10 µm.

19. The method according to claim 2, wherein the width of the trimming and separation lines is between 1 µm and 10 µm.

20. The method according to claim 3, wherein the width of the trimming and separation lines is between 1 µm and 10 µm.

21. A device including a transparent substrate at least partly covered with a transparent conductive oxide layer in which at least one electrode is structured, a trimming line separating the active part of the conductive oxide layer, which forms the electrode and which is brought to an electric potential, from the rest of the conductive oxide layer, which is floating, wherein it includes means for preventing stray capacitive coupling between the active part and the floating part of said conductive oxide layer.

22. The device according to claim 21, wherein the means for preventing stray capacitive coupling include a second trimming line formed around the first trimming line.

23. The device according to claim 21, wherein the means for preventing stray capacitive coupling include a separation line which segments the floating part of the conductive oxide layer into at least two distinct zones that are not electrically connected to each other.

24. The device according to claim 22, wherein the means for preventing stray capacitive coupling include a separation line which segments the floating part of the conductive oxide layer into at least two distinct zones that are not electrically connected to each other.

* * * * *